United States Patent
Haddad

[11] Patent Number: 5,805,499
[45] Date of Patent: Sep. 8, 1998

[54] CHANNEL HOT-CARRIER PAGE WRITE FOR NAND APPLICATIONS

[75] Inventor: Sameer S. Haddad, San Jose, Calif.

[73] Assignee: Advanced Micro Devices, Inc., Sunnyvale, Calif.

[21] Appl. No.: 810,164

[22] Filed: Feb. 28, 1997

[51] Int. Cl.[6] .................................................. G11C 11/34
[52] U.S. Cl. ................................ 365/185.19; 365/185.18
[58] Field of Search ........................... 365/185.19, 185.18

[56] References Cited

U.S. PATENT DOCUMENTS

| | | | |
|---|---|---|---|
| 4,611,309 | 9/1986 | Chuang et al. | 365/185.19 |
| 5,068,827 | 11/1991 | Yamada et al. | 365/185.19 |
| 5,544,117 | 8/1996 | Nakayama et al. | 365/185.19 |

*Primary Examiner*—Son T. Dinh
*Attorney, Agent, or Firm*—Davis Chin

[57] ABSTRACT

There is provided a novel method for performing low current channel hot-carrier programming in a NAND memory architecture. A first positive pulse voltage having a ramp-rate characteristic on its leading edge is applied to the drain of the select gate drain devices in the selected columns of bit lines during the programming operation. Simultaneously, a second positive pulse voltage is applied to the control gate of the select gate drain device and to the word lines of unselected memory cells so as to overlap the first positive pulse voltage. Further, a ramp voltage is applied to the word line of selected memory cells so as to permit fast programming thereof.

16 Claims, 6 Drawing Sheets

HIGHEST $V_t$ AFTER MEASUREMENT = -2.20V

Fig. 6 PROGRAMMING SPEED DEPENDENCE ON THE GATE VOLTAGE

Fig. 7 PROGRAMMING SPEED DEPENDENCE ON THE GATE VOLTAGE AND $V_{t, initial}$

"MULTIPLY PULSES" 'n'
PROGRAMMING SPEED = n X PW

SELECTED GATE VOLTAGE ADJUSTED
FOR BEST PROGRAMMING SPEED

CHANNEL HOT-CARRIER PAGE WRITE FOR NAND APPLICATIONS

BACKGROUND OF THE INVENTION

1. Field of the Invention

This invention relates generally to floating gate memory devices such as an array of Flash electrically, erasable programmable read-only memory (EEPROM) cells. More particularly, it relates to an improved programming scheme for performing low current channel hot-carrier page programming in a NAND memory architecture.

2. Description of the Prior Art

As is generally known in the art, there exists a class of non-volatile memory devices referred to as "Flash EEPROMS" which has recently emerged as an important memory device by combining the advantages of EPROM density with EEPROM electrical erasability. Such Flash EEPROMs provide electrical erasing and a small cell size. One type of architecture used for Flash memories is typically referred to as a NAND Flash memory architecture which is an array of Flash EEPROM cells (floating gate devices) arranged in rows of word lines and columns of bit lines intersecting the rows of word lines so as to form a matrix.

Typically, in a 32 Mb memory architecture the approximately 32 million memory cells are arranged in a regular matrix pattern of $2^{13}$ rows and $2^{12}$ columns. Preferably, groups of columns are organized such that each group defines a page. Each page represents a number of bytes. For instance, the $2^{12}$ columns may be divided into four pages so that each page will contain 128 bytes or 1,024 bits. Further, a predetermined number of rows may be grouped together so as to form a sector defining a selectable block. For example, the $2^{13}$ rows may be divided into 512 sectors with each sector containing 16 rows. In this case, each sector will consist of 64 K memory cells.

In each sector, each of the floating gate devices in each column of bit lines is connected in series to the next floating gate device by joining the source of one device to the drain of the next device. Each of the control gates of the floating gate devices in the same row is connected to a corresponding one of the word lines. Before the first word line, a select gate drain formed of a floating gate device is connected to a corresponding one of the columns of bit lines. Similarly, after the last word line a select gate source formed of a dual floating gate device is connected to the corresponding one of the columns of bit lines. Such a NAND Flash memory architecture is illustrated and described in co-pending application Ser. No. 08/668,632 filed on Jun. 18, 1996, and entitled "Using Floating Gate Devices as Select Gate Devices for NAND Flash Memory and its Bias Scheme." This Ser. No. 08/668,632 is assigned to the same assignee as the present invention and is hereby incorporated in its entirety by reference.

In an IEDM paper entitled "New Ultra High Density EPROM and Flash EEPROM With NAND Structure Cell" authored by F. Masuoka et al., IEDM, Vol. 87, pp. 552–555, there is described a NAND structure cell which is able to be programmed by hot electron injection to the floating gate. During the programming mode, a voltage of 9 volts is applied to the bit line, a voltage of 10 volts is applied to the control gate of the selected cell, and a voltage of 20 volts is applied to the control gates of the non-selected cells in the NAND structure. This IEDM paper is incorporated herein by reference.

In co-pending application Ser. No. 08/493,138 filed Jun. 21, 1995, to Sameer S. Haddad et al., and entitled "Channel Hot-Carrier Page Write," there is disclosed a EEPROM memory which has a stacked gate cell architecture and relies upon drain-side injection of hot carriers for programming at low drain current levels, thereby permitting charge pump programming of at least 1,024 memory cells with an increased writing speed. This Ser. No. 08/493,138 is also incorporated herein by reference, which is assigned to the same assignee as the present invention.

Further, in co-pending application Ser. No. 08/810,170 (Attorney Docket No. 96A-1825), filed on Feb. 28, 1997 to Sameer S. Haddad et al. and entitled "Optimized Biasing Scheme For NAND Read and Hot-Carrier Write Operations," there is disclosed a method for eliminating hot-carrier disturb during a read operation in a NAND memory architecture in which a floating gate device is used as a select gate. This is accomplished by applying a first positive pulse voltage having a ramp-rate characteristic on its leading edge to the drain of the floating gate device during the Read operation. Simultaneously, there is applied a second positive pulse voltage to the control gate of the floating gate device during the Read operation so as to overlap the first positive pulse voltage.

In the prior art NAND architecture using Fowler-Norheim tunnelling technique for charging or programming the Flash EEPROM cells, there is a disadvantage that a relatively high voltage of approximately 20 volts is required to be applied to the word lines coupled to the control gates of the selected cells to be programmed. As a consequence, there is a need for special high voltage circuits, such as high voltage charge pumps which increase manufacturing and assembly costs.

In order to eliminate the necessity of such a high voltage, there has been attempted in the prior art NAND architecture of utilizing a hot-carrier programming technique for charging or programming the Flash EEPROM cells, as described in the aforementioned IEDM paper. While it is noted that the gate voltage applied to the word lines of the selected memory cell was about 10 volts and the drain voltage applied to the bit line was about 9 volts, there existed a first disadvantage since it still required a voltage of 20 volts to be applied to the non-selected memory cells. Further, a second disadvantage was that the magnitude of the programming current per cell tended to be relatively high. Thus, the programming of a large number (more than 8) of Flash memory cells in the NAND architecture was unfeasible since the internal power sources are typically unable to supply programming current of such a large magnitude.

Therefore, it would be desirable to provide a method of programming in a NAND architecture which combines the use of hot-carrier programming so as to reduce high voltage requirements and the use of a low programming current of less than 10 $\mu$A per cell so as to increase the number of memory cells that can be programmed simultaneously (e.g., a page of cells—1024 or more).

The novel programming scheme of the present invention represents an implementation of the basic function of programming in an NAND memory architecture, utilizing the low current hot-carrier page programming technique described in the aforementioned Ser. No. 08/493,138 for a NOR memory architecture. Further, the method for eliminating hot-carrier disturb described in the aforementioned Ser. No. 08/810,170 (Attorney Docket No. 96A-1825) is applied to the non-selected cells in the NAND architecture so as to minimize the disturb on such non-selected cells.

SUMMARY OF THE INVENTION

Accordingly, it is a general object of the present invention to provide an improved programming scheme for performing low current channel hot-carrier page programming in a NAND memory architecture which overcomes the disadvantages of the prior art programming methods.

It is an object of the present invention to provide an improved programming scheme in a NAND memory architecture which relies upon channel hot-injection of hot carriers for programming at low drain current levels.

It is another object of the present invention to provide an improved programming scheme for performing low current channel hot-carrier page programming in a NAND memory architecture which requires a smaller programming current and has a relatively fast programming time than those traditionally available.

It is still another object of the present invention to provide an improved programming scheme for performing low current channel hot-carrier page mode programming in a NAND memory architecture which is realized by applying a word line voltage on the control gate of the select gate drain device and to the word lines of the unselected memory cells which overlaps the programming pulse applied to the drain of the select gate device during programming, simultaneously ramping up gradually the leading edge of the programming pulse so as to maintain the select gate drain device in the linear region, and applying a ramp voltage to the word lines of the selected memory cells.

In a preferred embodiment of the present invention, there is provided a programming method for performing low current channel hot-carrier programming in a NAND memory architecture. This is accomplished by applying a first positive pulse voltage having a ramp-rate characteristic on its leading edge to the drain of the select gate drain device in the selected column of bit lines during the programming operation. Simultaneously, there is applied a second positive pulse voltage to the control gate of the select gate drain device and to the word lines of the unselected memory cells so as to overlap the first positive pulse voltage. Further, a ramp voltage is applied to the word lines of the selected memory cells so as to permit fast programming of the selected memory cells.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
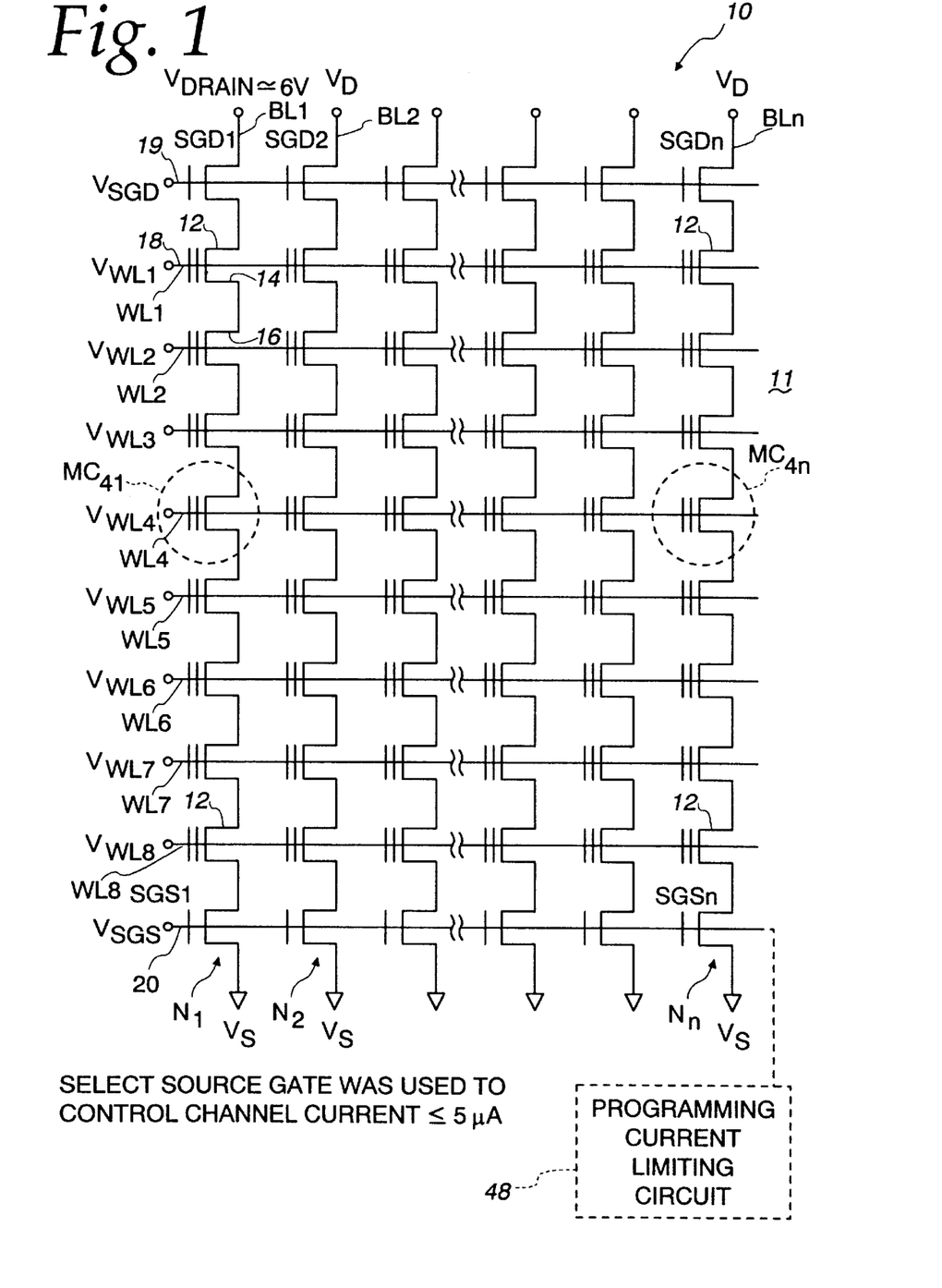
FIG. 1 is a schematic circuit diagram of a conventional NAND Flash memory architecture of the prior art in which the programming scheme of the present invention can be employed.

Referring now in detail to the drawings, there is illustrated in FIG. 1 a schematic circuit diagram of a conventional NAND Flash memory architecture 10 of the prior art in which the novel programming scheme for performing channel hot-carrier page programming at low drain current levels can be employed according to the present invention. The NAND Flash memory architecture 10 includes an array sector 11 of Flash electrically erasable and programmable read-only memory (EEPROM) cells 12 (floating gate transistor devices) arranged in rows of word lines WL1, WL2, . . . WL8 and columns of bit lines BL1, BL2, . . . BLn intersecting the rows of word lines so as to form the sector. For the sake of simplicity, only a portion of the NAND strings N1, N2, . . . Nn in the bit lines BL1, BL2, . . . BLn in the array sector 11 has been shown. Each of the NAND strings consists of eight memory cells 12 coupled between two select gate devices.

It is to be clearly understood that the sector 11 represents only one of a large number of identical sectors provided on a single integrated circuit memory chip. Although the number of rows of word lines in the sector has been illustrated to be only eight in FIG. 1, it should be apparent to those skilled in the art that the number of rows of word lines could be 16 or even as high as 32. Further, the number of columns of bit lines could be 1,024 (i.e., n=1,024) or even as high as 4,096. Thus, each row corresponds to a page or a number of pages. For example, in a 32 Mb memory architecture there may be 512 sectors, each sector being formed of 16 rows of word lines and 4,096 columns of bit lines. The 4,096 columns of bit lines may be divided into four pages so that each page contains 1,024 columns of bit lines.

As can be seen, in the array sector each of the floating gate transistor devices 12 in each column of the bit lines BL1 . . . BLn is connected in series to the next floating gate transistor device 12 by joining the source 14 of one transistor device to the drain 16 of the next transistor device 12. Each of the control gates 18 of the transistor devices 12 in the same row is connected to a corresponding one of the word lines WL1 . . . WL8. Before the first word line WL1, the select gate drain formed of a single gate transistor SGD1 . . . SGDn is coupled between one end of corresponding ones of the NAND strings and corresponding ones of the columns of bit lines BL1 . . . BLn. For example, the drain of the transistor SGD1 is connected to a first power supply or potential $V_D$ and the source of the transistor SGD1 is connected to the drain of the array floating gate transistor 12 associated with the first word line WL1 in the NAND string N1. Similarly, the drain of the transistor SGD2 is connected to the supply potential $V_D$ and the source of the transistor SGD2 is connected to the drain of the array floating gate transistor 12 associated with the first word line in the NAND string N2. Finally, the drain of the transistor SGDn is connected to the supply potential $V_D$ and the source of the transistor SGDn is connected to the drain of the floating gate transistor 12 associated with the first word line WL1 in the NAND string Nn. The gates of all of the select gate transistors SGD1 . . . SGDn are connected together and to a common line 19.

After the last word line WL8, a select gate source formed of single gate transistors SGS1 . . . SGSn is coupled between the other end of corresponding ones of the NAND strings and a ground potential $V_S$. For example, the drain of the transistor SGS1 is connected to the source of the array floating gate transistor 12 associated with the last word line WL8 in the NAND string N1 and the source of the transistor SGS1 is connected to a second supply voltage or potential $V_S$. Similarly, the drain of the transistor SGS2 is connected to the source of the array floating gate transistor 12 associated with the last word line WL8 in the NAND string N2 and the source of the transistor SGS2 is connected to the second supply potential $V_S$. Finally, the drain of the transistor SGSn is connected to the source of the array floating gate transistor 12 associated with the last word line WL8 in the NAND string Nn and the source of the transistor SGSn is connected to the second supply voltage $V_S$.

The gates of the single gate transistors SGS1 . . . SGSn are connected together and to a common line 20. It will also be noted that the word lines WL1 . . . WL8 are connected to receive a respective word line voltage $V_{WL1}$. . . $V_{WL8}$. Further, the gates of the select gate drain transistors SGD1 . . . SGDn on the line 19 are connected to receive a select gate drain voltage $V_{SG,D}$. The gates of the select gate source transistors SGS1 . . . SGSn on the line 20 are connected to receive a select gate source voltage $V_{SG,S}$. Although the select gate drain devices and the select gate source devices in FIG. 1 have been depicted as a single gate transistor, it should be apparent to those skilled in the art that floating gate transistors could be used instead.

During normal programming operation, a high drain voltage $V_D$ is applied (e.g., bit line BL1 for the NAND string N1) to the drain of the select gate drain transistor SGD1. Typically, the voltage $V_D$ will be approximately +6 volts for a 3 V Flash EEPROM array, and the supply voltage $V_S$ will be typically at zero volts. In order to pass this programming drain voltage $V_D$ to the selected memory cell in the NAND string, a sufficiently high voltage must be applied to the gates of the select gate drain transistor SGD1 and to all of the gates of the non-selected memory cell transistors. A problem is encountered when the programming drain voltage $V_D$ rises too quickly so as to cause the drain-to-source voltage $V_{ds}$ across the selected gate drain and the non-selected memory transistors to be greater than 1 volt. This will produce an undesired hot-carrier disturb on the select gate drain and the non-selected memory cell transistors.

Before describing in detail the novel programming scheme for performing channel hot-carrier page programming at low drain current levels in a NAND Flash memory architecture according to the present invention, it is believed that it would be helpful in understanding the principles of the instant invention and to serve as a background by first explaining the investigations performed and the results of the experimentation observed by the inventor.

Figures 2A, 2B:
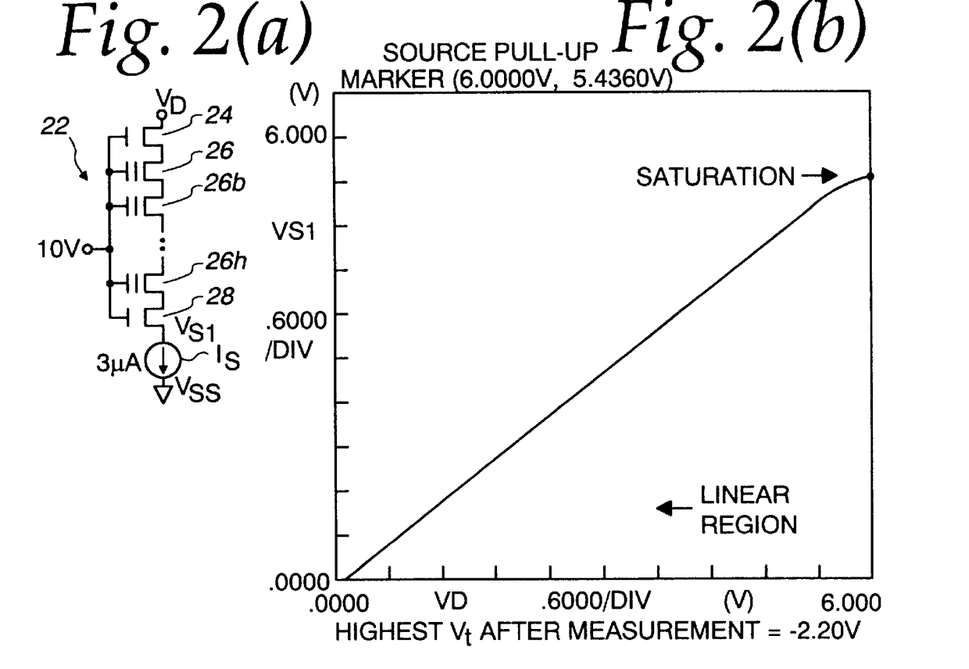
FIG. 2(a) is a schematic circuit diagram of an experimental set-up, illustrating the bias conditions for passing the programming drain voltage.
FIG. 2(b) shows the measured source pull-up voltage $V_{S1}$ as a function of sweeping the drain voltage $V_D$ positively on the circuit of FIG. 2(a)

Initially, a NAND string circuit 22 of FIG. 2(a) was constructed. As will be noted, the NAND string circuit consists of a single gate poly I transistor 24 used as a select gate drain, 8 floating gate transistors 26a–26h, a single gate poly I transistor 28 used as a select gate source, and a constant current source $I_S$ all connected in series with each other between the drain voltage $V_D$ and the ground potential VSS. All of the gates of the transistors 24, 26a–26h, and 28 were connected to a voltage of +10 volts. The constant current source $I_S$ was set to equal 3 μA.

In FIG. 2 (b), the source pull-up voltage $V_{S1}$ in the circuit of FIG. 2(a) is plotted as the voltage $V_D$ applied to the drain of the transistor 24 is swept positively from 0 V to +6 V. As can be observed, when the drain voltage $V_D$ is equal to +6 V, the source pull-up voltage $V_{S1}$ is equal to +5.4 volts. Thus, this infers that approximately 0.6 V was dropped across the floating gate transistor having the highest threshold voltage $V_t$, which was measured to be equal to approximately -2.20 volts. Accordingly, this graph of FIG. 2(b) demonstrates the word line voltage required to pass the drain voltage $V_D$ through the NAND string. This operation suggests that no hot-carrier disturb will occur if the select gate drain device and the non-selected memory cell transistors are maintained in the linear region so as to minimize the drain-to-source voltage $V_{ds}$ across their channels. Therefore, by controlling the pulse applied to the gates of the select gate drain device and the non-selected memory cell transistors to overlap the programming pulse applied to the drain of the select gate drain device, there would be no hot-carrier program disturb.

Figures 3A, 3B:
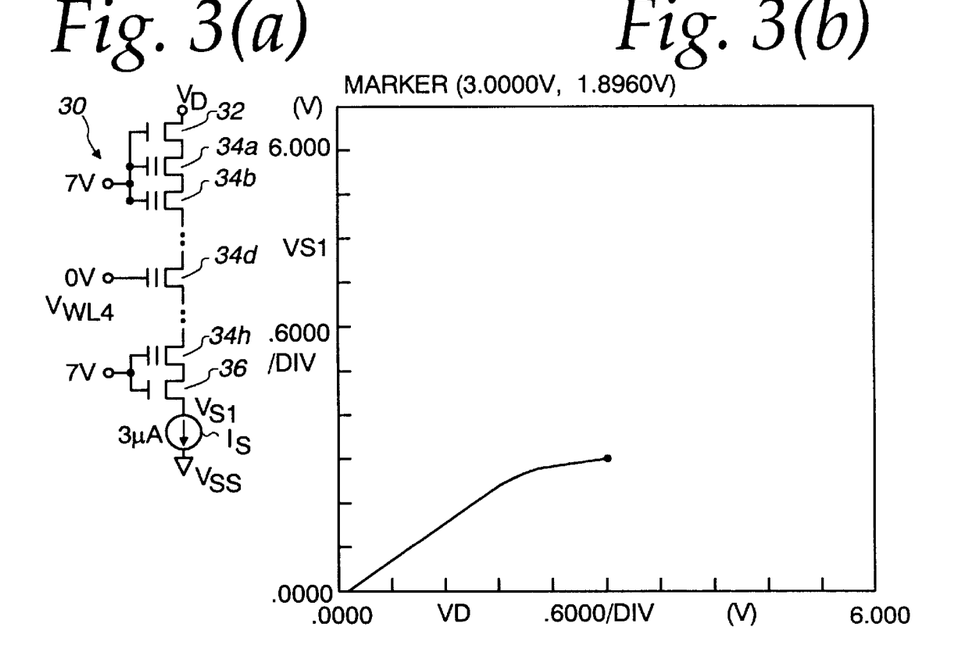
FIG. 3(a) is a schematic circuit diagram of an experimental set-up, illustrating the DC programming conditions.
FIG. 3(b) shows the source pull-up voltage $V_{S1}$ as a function of sweeping the drain voltage $V_D$ positively on the circuit of FIG. 3(a)

In order to demonstrate the DC programming condition, a NAND string circuit 30 was constructed as shown in FIG. 3(a) of the drawings. As can be seen, the NAND string circuit 30 includes a single gate transistor 32 used as a select gate drain, 8 floating gate transistors 34a–34h, a single gate transistor 36 used as a select gate source, and a constant current source $I_S$ all connected together in series with each other between the drain voltage $V_D$ and the ground potential $V_{SS}$. All of the gates of the non-selected floating gate transistors 34a–34c and 34e–34h are connected to +7 volts and the gate of the selected floating gate transistor 34d is connected to 0 volts. In FIG. 3(b), there is plotted the source pull-up voltage $V_{S1}$ as the voltage applied to the drain of the transistor 32 is swept positively between 0 volts and +6 volts. It is significant to note that at the drain voltage $V_D$ =+3 V the source pull-up voltage $V_{S1}$ will be equal to approximately 1.9 volts. This implies that the drain-to-source voltage $V_{ds}$ across the selected floating gate transistor 34d is equal to +1.1 volts.

Figure 4:
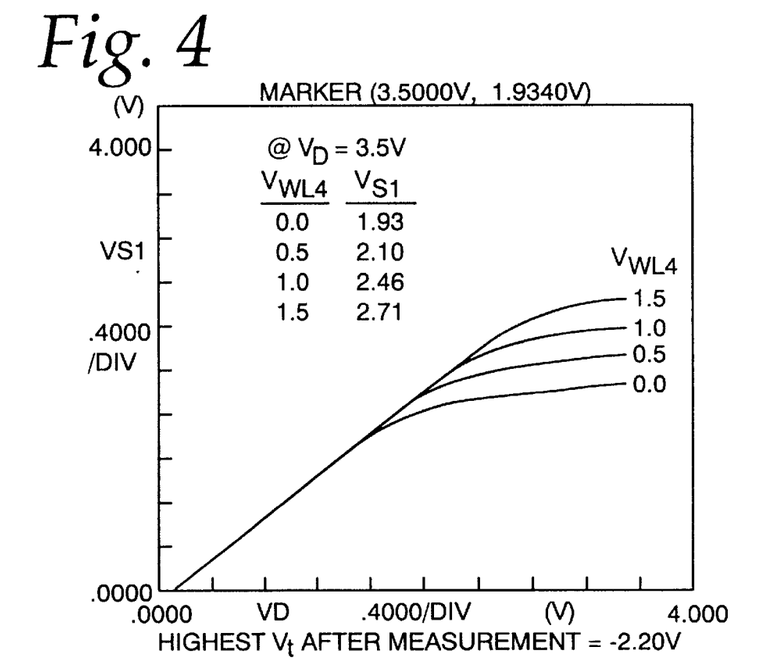
FIG. 4 shows the measured source pull-up voltage $V_{S1}$ as a function of the different gate voltages applied to the control gate of the selected cell per the inset with a fixed drain voltage on the circuit of FIG. 3 (a)

In FIG. 4, using the same circuit of FIG. 3(a), there is plotted the source pull-up voltage $V_{S1}$ for the different gate voltages applied to the gate of the selected floating gate transistor 34d with a fixed drain voltage of +3.5 volts. It will be observed that as the gate voltage applied to the selected floating gate transistor 34d is increased the source pull-up voltage will also increase thereby causing the drain-to-source voltage $V_{ds}$ across its drain to decrease. As a result, there has been demonstrated the dependence of programming on the voltage applied to the gate of the selected memory cell transistor.

Figures 5A, 5B:
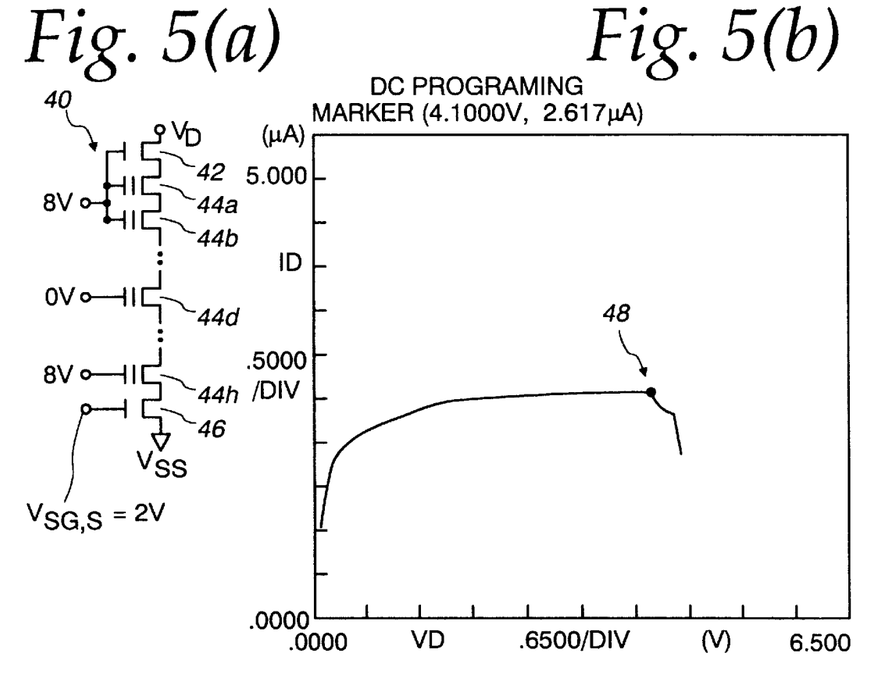
FIG. 5(a) is a schematic circuit diagram of an experimental set-up, illustrating the DC programming conditions.
FIG. 5(b) shows the measured channel current as a function of sweeping the drain voltage on the circuit of FIG. 5(a)

In FIG. 5(a), there is shown a schematic circuit diagram of a NAND string circuit 40 which is comprised of a single gate poly I transistor 42 used as a select gate drain, 8 floating gate transistors 44a–44h, and a single gate poly I transistor 46 used as a select gate source all connected in series with each other between the drain voltage $V_D$ and the ground potential $V_{SS}$. All of the gates of the non-selected floating gate transistors 44a–44c and 44e–44h are connected to +8 volts and the gate of the selected floating gate transistor 44d is connected to 0 volts. Further, the gate of the select gate drain 42 is also connected to +8 volts, and the gate of the select gate source 46 is connected to +2 V in order to provide a channel current of approximately 3 μA. In FIG. 5(b), there is plotted the programming drain current $I_D$ as the voltage $V_D$ applied to the drain of the transistor 42 is swept positively between 0 V and +6.5 V. It will be observed that at the beginning of programming (point 48) the drain voltage $V_D \approx$ +4.1 V.

Figure 6:
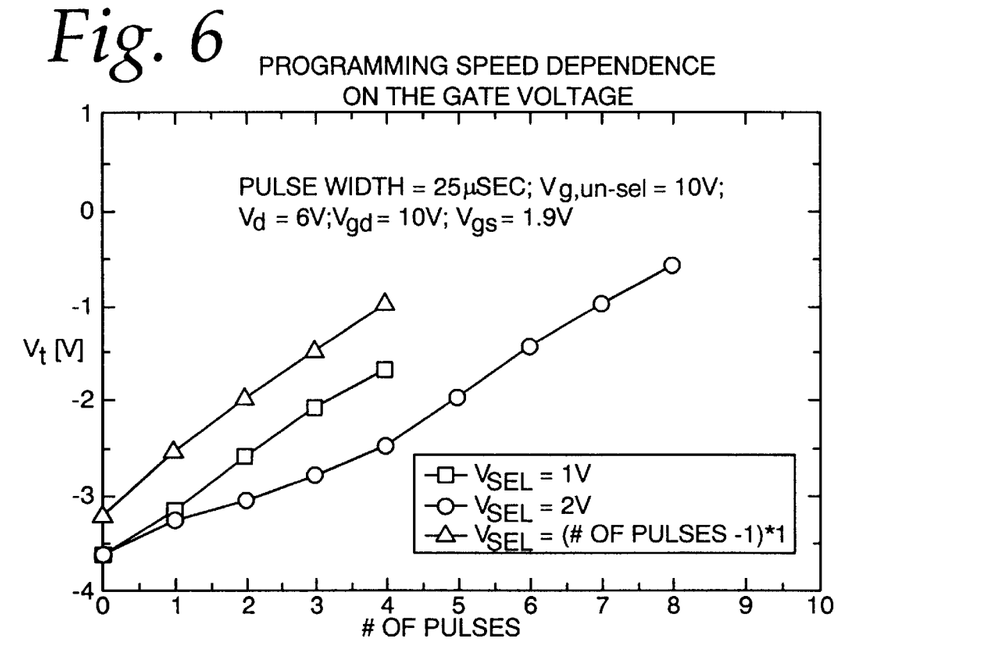
FIG. 6 illustrates the programming speed dependence on the voltage applied to the control gate of the selected cell.

In order to demonstrate the programming speed dependence on the gate voltage $V_{SEL}$ applied to the control gate of the selected floating gate transistor during a programming operation, the test set-up of FIG. 5 (*a*) was used again. Initially, all of the floating gate transistors were discharged to a threshold voltage $V_t \leq -3$ V. Then, at this time all of the gates of the unselected floating gate transistors were applied with +10 V. The drain voltage $V_D$ applied to the drain of the select gate drain was +6 V. The channel current of ≈3 μA was set up by biasing the gate of the select gate source at +1.9 V. There is plotted in FIG. 6 the programming speed as measured by the threshold voltage $V_t$ shift as a function of time for three different gate voltages $V_{SEL}$ as defined in the inset. It will be noted that the condition of the gate voltage $V_{SEL}$ being equal to a constant +2 V renders the slowest programming (charging) speed. The best results of the programming speed was obtained when the condition of the gate voltage $V_{SEL}$ simulated a ramp voltage which was achieved by applying a series of pulses each having a pulse width of 25 μSec. As can be seen, after 100 μSec the threshold voltage $V_t$ shift was more than 2.5 V.

Figure 7:
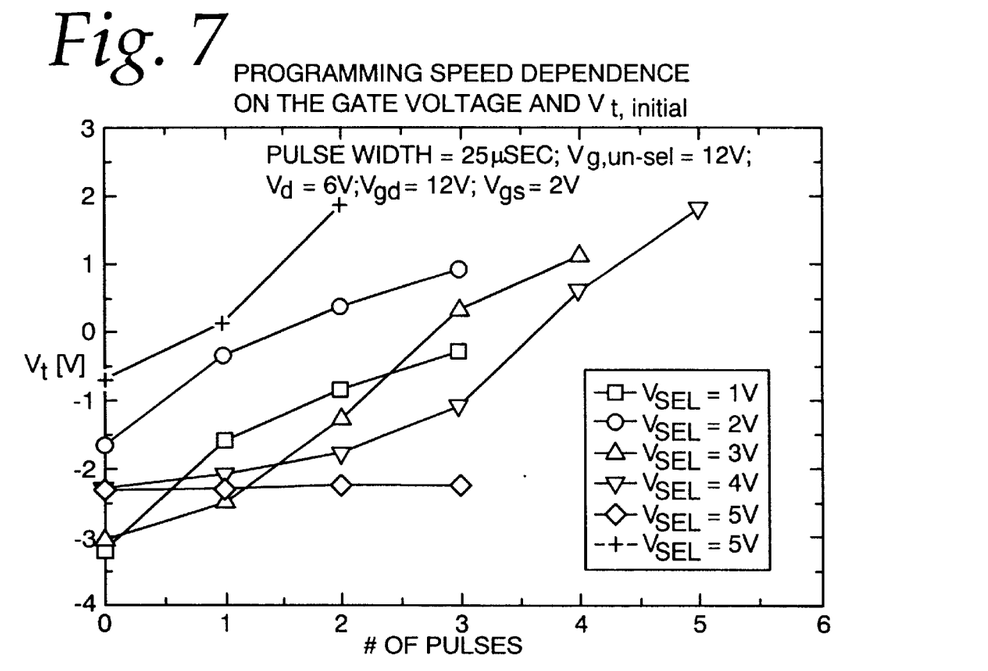
FIG. 7 illustrates the programming speed dependence on the gate voltage and the initial threshold voltage of the selected cell.

In order to further demonstrate the programming speed dependence on the gate voltage and the initial threshold voltage $V_{t,int}$ of a cell, the test set-up of FIG. 5(a) was used once again. All of the gates of the unselected memory cells and the gate of the select gate drain were applied with +12 V. The drain voltage $V_D$ applied to the drain of the select gate drain was again +6 V. The channel current was established by biasing the gate of the select gate source at +2 V. There is plotted in FIG. 7 the programming speed as measured by the threshold voltage $V_t$ shift as a function of time for the six different gate voltages $V_{SEL}$ as defined in the inset with various initial threshold voltages. It can be seen that no programming occurs when the highest select gate voltage $V_{SEL}$ =+5 V was applied with the initial threshold voltage $V_{t,int}$ of −2.2 V. This data demonstrates that no program disturb condition will occur on the unselected cell if the gate (pass) voltage is sufficiently high so as to maintain the cell in the linear region. However, it will be noted that there will be programming for a cell with the same high select gate voltage $V_{SEL}$ =+5 V and with an initial threshold voltage of −0.75 V. This indicates that the select gate voltage $V_{SEL}$ must be optimized so as to produce a maximum drain-to-source voltage $V_{ds}$ across its channel for fast programming.

Figure 8:
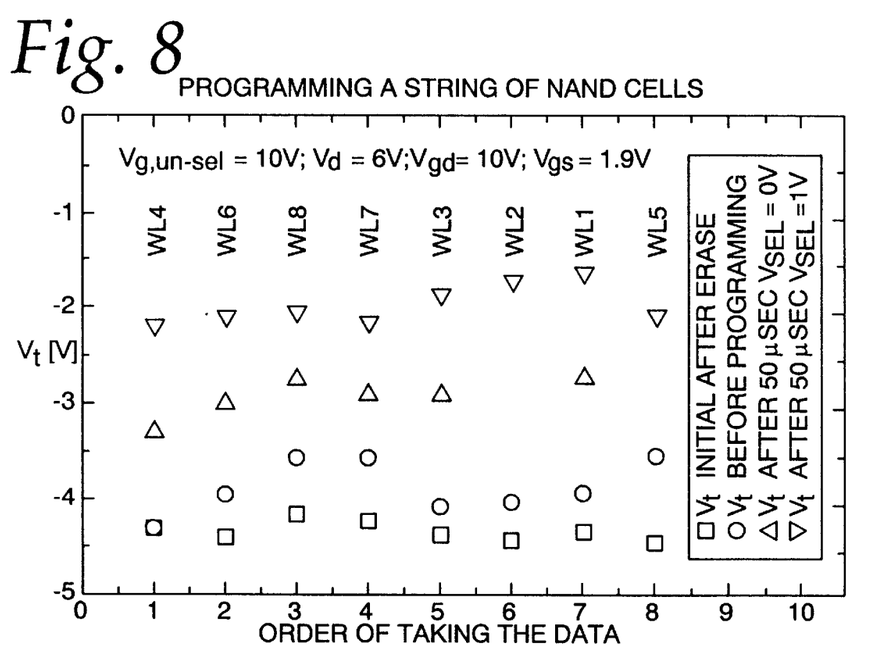
FIG. 8 shows the programming speed and the disturb characteristics of a string of NAND cells as a function of the order in which the cells are programmed.

Finally, the inventor conducted an investigation to explain the programming speed dependence and the disturb characteristics of the NAND string circuit of FIG. 5(a) as a function of the order in which the cells are being programmed. All of the gates of the unselected memory cells and the gate of the select gate drain were applied with +10 V. The drain voltage $V_D$ applied to the drain of the select gate drain was again +6 V. The channel current was established by biasing the gate of the select gate source at +1.9 V. There is plotted in FIG. 8 the programming speed as measured by the threshold voltage $V_t$ shift as defined by the inset as a function of the order of programming of the cells. This data demonstrates that some programming disturb does exist as measured by the threshold difference between after erase and before programming. The change in the threshold voltage after 100 μSec is larger than 1.5 V.

The programming operation of the NAND memory architecture 10 of FIG. 1 will now be explained with reference to FIGS. 9(a) through 9(c). Initially, it will be assumed that all of the memory cells have been erased to a threshold voltage less than −3 V. It will be further assumed that the transistor cells $MC_{41}$–$MC_{4n}$ defining the selected cells for a page are desired to be programmed. The gates of the selected cells $MC_{41}$–$MC_{4n}$ are connected to the word line WL4. The other transistor cells 12 are referred to as the unselected cells. The novel programming scheme for performing channel hot-carrier programming at low drain current levels on the selected cell and minimizing the hot-channel carrier disturb on the unselected cells in accordance with the principles of the present invention is accomplished by controlling the gate voltage on the unselected cells to overlap the programming pulse applied to the drain of the select gate drain device and controlling simultaneously the gate voltage on the selected cell so as to ramp up gradually. As a result, the improved programming scheme will maintain a high drain-to-source voltage across the selected cell so as to allow fast programming and will maintain a low drain-to-source voltage across the unselected cells so as to minimize hot-carrier disturb.

Referring now in particular to FIG. 9 (*a*), there is illustrated the waveform of the pass gate pulse voltages $V_{SG,D}$ and $V_{WL1}$–$V_{WL3}$, $V_{WL5}$–$V_{WL8}$ applied to the respective gates of the select gate drain transistors SGD1 ... SGDn and the unselected cells in the NAND strings N1–Nn of the NAND memory architecture 10 during the programming operation. In order to provide a very low programming current so as to greatly increase the number of cells which can be programmed simultaneously and thus increasing the programming speed a gate voltage $V_{SG,S}$ is applied to the select gate source transistors SGS1–SGSn so as to obtain a channel current of less than 5 μA during programming. A cell programming current limiting circuit 48 is connected to the gates of the select gate source transistors for limiting the channel current. This limiting circuit may be implemented in a number of ways which will be apparent to those skilled in the art. For example, a constant current source circuit may be used to limit the cell programming current.

Figures 9A, 9B, 9C:
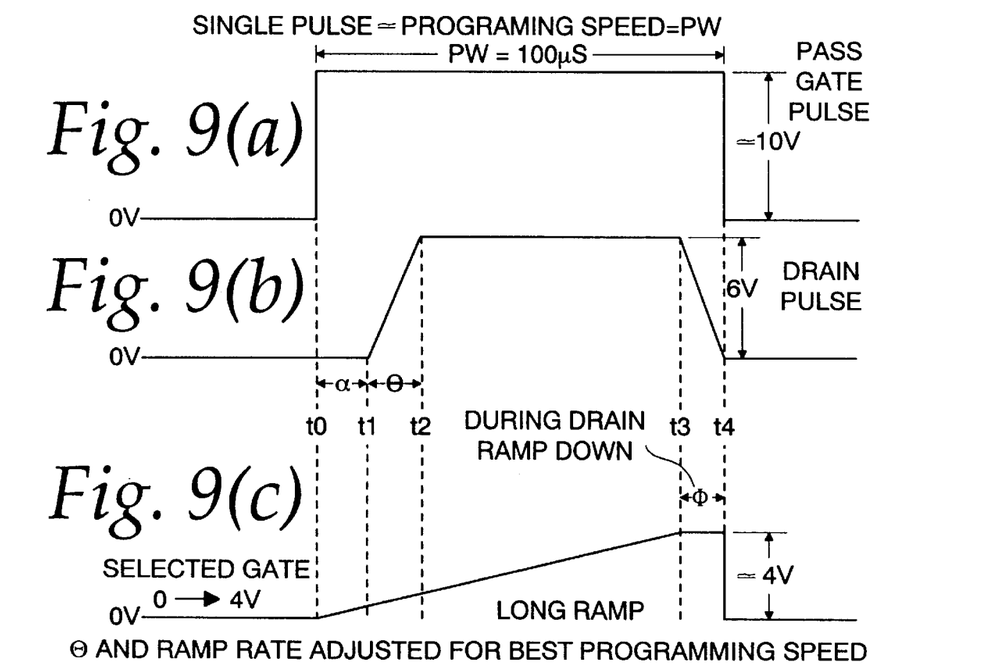
FIGS. 9(a) through 9(c) are respective waveforms of the voltages applied to the control gates of the select gate drain transistor and the non-selected memory cell transistors, to the drain of the select gate drain transistors, and to the control gate of the selected memory cell transistors during the programming operation, according to a first embodiment of the present invention.

In FIG. 9(b), there is depicted the waveform of the programming pulse $V_D$ applied to the drain of the select gate drain transistors SGD1–SGDn during this pro gramming operation. In FIG. 9(c), there is shown the waveform of the voltage $V_{WL4}$ applied to the control gates of the selected memory cells $MC_{41}$–$MC_{4n}$ during the programming operation.

As can be seen, when the pass gate pulse voltage of approximately +10 V in FIG. 9(a) is applied to the line 19 (gates) of the select gate transistor devices SGD1 ... SGDn and to the word lines WL1 ... WL3, WL5 ... WL8 (control gates) of the unselected cells 12 at time t0, there is an overlap time α between the time t0 and t1 where the programming pulse begins to ramp. The ramp-rate characteristic of leading edge 50 is such that it ramps up gradually from 0 volts to approximately +6 volts over a time interval θ. This time interval θ is between the time t1 and time t2

(final maximum drain voltage). This time interval is selected so that the ramp-rate characteristic is sufficiently slow so as to allow the source voltage on the selected gate drain device to follow its drain voltage. As a result, all of the unselected memory cells 12 are maintained to operate in the linear region so as to avoid hot-carrier disturb. It will be noted thus far that the present programming scheme is quite similar to the Read operation described in the aforementioned co-pending application Ser. No. 08/810,170 (Attorney Docket No. 96A-1825). In this manner, the drain voltage $V_D$ required to program the memory cells $MC_{41}$–$MC_{4n}$ in the NAND strings N1–Nn is passed down by the gate pulse voltage which must be sufficiently high to pass this drain voltage through even a previously programmed cell.

Simultaneously, between the times t0 and t3 the gate voltage $V_{WL4}$ applied to the selected memory cells $MC_{41}$–$MC_{4n}$, is ramped up gradually from 0 V to approximately +4 volts to permit a high drain-to-source voltage $V_{ds}$ to be developed thereacross. The maximum gate voltage needed is dependent upon the erased threshold voltage $V_t$ of the selected memory cell. In other words, for higher threshold voltages $V_t$ the gate voltage will be required to be higher in order to establish the same fast programming speed. Thus, the ramp-rate characteristic for the gate voltage $V_{WL4}$ is selected for optimal programming speed over a wide distribution of erased threshold voltages $V_t$.

It will be noted at the time t3 the final maximum gate voltage $V_{WL4}$ has been reached and occurs before the end of the pass gate pulse voltage at time t4 in FIG. 9(a). The pulse width of the single pass gate pulse voltage is approximately 100 μS between the times t0 and t4. The time interval between the time t3 and the time t4 is defined to be Φ. As can be appreciated by those skilled in the art, the ramp rate of the gate voltage $V_{WL4}$ and the time Φ can be adjusted in order to obtain the fastest programming speed. In other words, the maximum gate voltage can be made so as to reach 4 V before the time t3, thereby rendering a longer time interval Φ. On the other hand, the maximum gate voltage can be set higher than 4 V so that it is reached after the time t4, thus causing the time interval Φ to be equal to zero.

In FIGS. 9 (d) through 9 (f), there are illustrated waveforms similar to respective FIGS. 9 (a) through 9 (c) which are used in an alternate embodiment during the programming operation of the NAND memory architecture of FIG. 1. As can be seen, the shape of the waveforms of FIGS. 9(d) and 9(e) are identical to FIGS. 9(a) and 9(b), respectively. The only difference is that the pulse width of the pass gate voltage is in the range of 10 μS–50 μS between the times t0 and t4. In FIG. 9(f), instead of a ramp voltage there is provided a pulse voltage having a predetermined magnitude of M. The magnitude of the pulse voltage is adjustable in order to achieve the fastest programming speed.

Figure 9D:
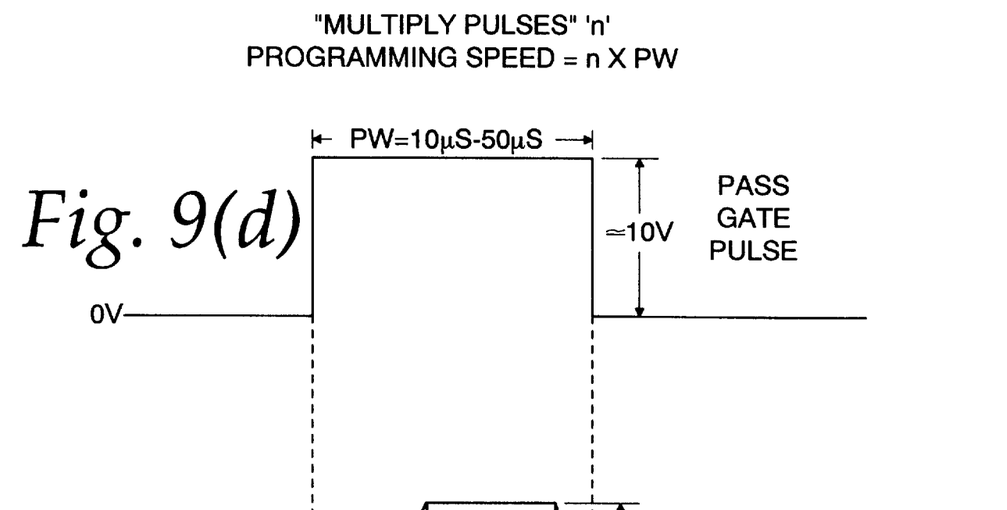
FIGS. 9(d) through 9(f) are waveforms similar to respective FIGS. 9(a)–9(c) which are used during the programming operation, according to a second embodiment of the present invention.
Figure 9E:
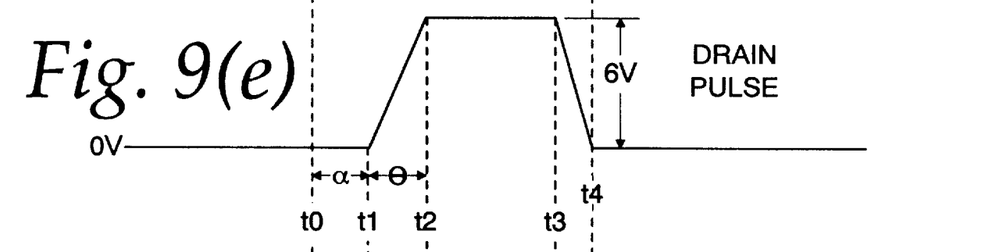
Figure 9F:
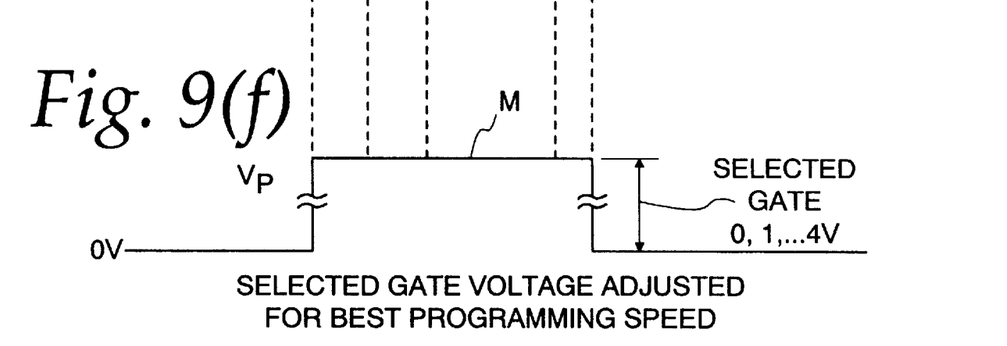

In operation, there is applied a series of pass gate pulse voltages of FIG. 9(d) each having the same pulse width. For example, if the pulse width is set to 50 μS then four such pulses would be applied to obtain the same programming speed of 100 μS in FIG. 9(a). Simultaneously, the programming pulse $V_D$ of FIG. 9(e) would be applied to the drain of the select gate drain transistors SGD1–SGDn. Also, the pulse voltage $V_P$ would be applied to the control gates of the selected memory cells $MC_{41}$–$MC_{4n}$. However, it should be understood that the magnitude of the first pulse voltage could be zero volts, the magnitude of the second pulse voltage could be one volt, the magnitude of the third pulse could be two volts, and so on so as to simulate the ramp voltage of FIG. 9 (c). Alternatively, magnitude of each pulse applied to the selected memory cells could be varied independently each time (e.g., 0 to 4 volts) so as to optimize the programming speed.

From the foregoing detailed description, it can thus be seen that the present invention provides an improved programming scheme for performing low current channel hot-carrier page programming in a NAND memory architecture. The programming scheme of the present invention maintains a high drain-to-source voltage across the selected memory cell so as to allow fast programming and will maintain a low drain-to-source voltage across the unselected cells so as to minimize hot-carrier disturb. This is achieved by applying a first positive pulse voltage having a ramp-rate characteristic on its leading edge to the drain of the select gate drain device in the selected column of bit lines during the programming operation and simultaneously applying a second positive pulse to the control gate of the select gate drain device and to the word line of the unselected memory cells so as to overlap the first positive pulse voltage. Further, a ramp voltage is applied to the word line of the selected memory cell so as to permit fast programming thereof.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

I claim:

1. A method for performing low current channel hot-carrier programming in a NAND memory architecture, said NAND memory architecture being formed of an array of Flash EEPROM memory cells arranged in rows of word lines and columns of bit lines intersecting the rows of word lines, where each memory cell in each column of bit lines includes a floating gate device which is connected in series to the next floating gate device by joining the source of one device to the drain of the next device, each of the control gates of the floating gate devices in the same row being connected to a corresponding one of the word lines, a select gate drain device being connected to a corresponding one of the columns of bit lines before the first word line, and a select gate source device being connected to the corresponding one of the columns of bit lines after the last word line, said method comprising the steps of:

applying a first positive pulse voltage having a ramp-rate characteristic on its leading edge to the drain of the select gate drain device in the selected column of bit lines during the programming operation;

simultaneously applying a second positive pulse voltage to the control gate of the select gate drain device and to the word line of the unselected memory cells so as to overlap the first positive pulse voltage; and applying a ramp voltage to the word line of selected memory cells so as to permit fast programming of the selected memory cells.

2. A method as claimed in claim 1, wherein said second positive pulse voltage has a magnitude higher than the magnitude of said first positive pulse voltage.

3. A method as claimed in claim 2, wherein said first positive pulse voltage has a magnitude between +5.5 volts to +6.0 volts.

4. A method as claimed in claim 3, wherein said second positive pulse voltage has a magnitude between +9.5 volts to +10.0 volts.

5. A method as claimed in claim 4, wherein said first positive pulse voltage has a width of approximately 100 µSec.

6. A method as claimed in claim 5, wherein said ramp voltage has an initial magnitude of 0 volts and gradually increases to the magnitude of approximately +4.0 volts.

7. A method as claimed in claim 1, wherein said ramp-rate characteristic is sufficiently slow so as to permit the source voltage on the select gate drain device and the unselected memory cells to follow the drain voltage.

8. A method as claimed in claim 1, further comprising means operatively connected to said select gate drain source devices for limiting a programming drain current to be less than 5 µA per memory cell.

9. A method for performing low current channel hot-carrier programming in a NAND memory architecture, said method comprising the steps of:

applying a series of positive pulse voltages having a ramp-rate characteristic on its leading edge to the drain of the select gate drain device in the selected column of bit lines during the programming operation;

simultaneously applying a series of second positive pulse voltage to the control gate of the select gate drain device and to the word line of the unselected memory cells so as to overlap the first positive pulse voltage; and applying a series of third positive pulse voltages to the word line of selected memory cells so as to permit fast programming of the selected memory cells.

10. A method as claimed in claim 9, wherein each of said second positive pulse voltages has a magnitude higher than the magnitude of said first positive pulse voltages.

11. A method as claimed in claim 10, wherein each of said first positive pulse voltages has a magnitude between +5.5 volts to +6.0 volts.

12. A method as claimed in claim 11, wherein each of said second positive pulse voltages has a magnitude between +9.5 volts to +10.0 volts.

13. A method as claimed in claim 12, wherein each of said first positive pulse voltages has a width in the range of 25–50 µSec.

14. A method as claimed in claim 13, wherein each of said third positive pulse voltages has a magnitude between 0 volts and +4.0 volts.

15. A method as claimed in claim 9, wherein said ramp-rate characteristic is sufficiently slow so as to permit the source voltage on the select gate drain device and the unselected memory cells to follow the drain voltage.

16. A method as claimed in claim 9, further comprising means operatively connected to said select gate drain source devices for limiting a programming drain current to be less than 5 µA per memory cell.

* * * * *

UNITED STATES PATENT AND TRADEMARK OFFICE
CERTIFICATE OF CORRECTION

PATENT NO. : 5,805,499
DATED : September 8, 1998
INVENTOR(S) : Sameer S. Haddad

It is certified that error appears in the above-indentified patent and that said Letters Patent is hereby corrected as shown below:

Column 8, line 53, change "pro gramming" to
-- programming --.

Signed and Sealed this

Twenty-ninth Day of December, 1998

Attest:

BRUCE LEHMAN

Attesting Officer

Commissioner of Patents and Trademarks